United States Patent [19]

Norton

[11] Patent Number: 4,722,654

[45] Date of Patent: Feb. 2, 1988

[54] ARTICLE TRANSFER SYSTEM

[75] Inventor: Fred M. Norton, Titusville, N.J.

[73] Assignee: RCA Corporation, Princeton, N.J.

[21] Appl. No.: 880,031

[22] Filed: Jun. 30, 1986

[51] Int. Cl.$^4$ ............................................. B65G 25/00
[52] U.S. Cl. .................................................... 414/217
[58] Field of Search ................. 414/217; 403/118, 348

[56] References Cited

U.S. PATENT DOCUMENTS

| | | | |
|---|---|---|---|
| 2,317,729 | 4/1943 | Bruno | 285/180 |
| 3,272,347 | 9/1966 | Lemelson | 214/1 |
| 3,851,543 | 12/1974 | Krom | 403/118 X |
| 4,400,856 | 8/1983 | Tseng | 403/348 X |
| 4,516,435 | 5/1985 | Outlaw et al. | 414/217 X |
| 4,520,550 | 6/1985 | Dunn et al. | 29/568 |
| 4,542,712 | 9/1985 | Sato et al. | 414/217 X |
| 4,605,469 | 8/1986 | Shih et al. | 414/217 X |
| 4,643,627 | 2/1987 | Bednorz et al. | 414/217 |

Primary Examiner—Joseph Falk
Attorney, Agent, or Firm—Allen L. Limberg; William Squire

[57] ABSTRACT

A load lock chamber is secured to a Rutherford Backscattering Spectrometer in communication with the spectrometer chamber. A valve separates the two chambers. A specimen manipulator transfers a specimen attached to a transfer member to a specimen support in the spectrometer chamber. The transfer member is releasably attached to the manipulator and to the specimen support for simplifying transfer of the specimen. The vacuum of the spectrometer is always maintained by evacuating the load lock chamber before transfer of the specimen in and out of the spectrometer chamber.

12 Claims, 10 Drawing Figures

ARTICLE TRANSFER SYSTEM

This invention relates to an article transfer system for transferring an article from one chamber to a second chamber.

A Rutherford Backscattering Spectrometer comprises a large and sophisticated system which generates a helium ion beam approximately one millimeter in diameter having energy of approximately two million electron volts. This beam is aimed at a specimen supported in an evacuated chamber and analyzes the backscattered energy reflected by the specimen. The chamber is required to be kept at a relatively high vacuum, e.g., $10^{-9}$ torr. The specimen support apparatus in the chamber includes a Goniometer which manipulates the specimen in the chamber, rotating it about a horizontal axis, a vertical axis, and displaces it vertically. Because of the high vacuum, the chamber is relatively thick walled and has a number of windows whose covers are attached to the chamber by a large array of bolts, typically 20 or more. Other apertures coupled to the chamber for connecting different apparatus to the chamber have covers similarly bolted in place. Typically a window is about nine inches in diameter.

In the prior art Rutherford Backscattering Spectrometer, placing a specimen in its chamber requires the 20 or more bolts to be removed by hand, one at a time, to remove one of the windows. The windows are sealed to the supporting structure with copper gaskets which need to be replaced each time the windows are removed. The operator's hand is inserted through the window opening into the chamber and bolts a specimen to a sample support apparatus in the chamber. Also, opening the window to ambient atmosphere and placing one's hand in the instrument's chamber contaminates the chamber. The contamination includes dust, moisture, and other particles. Also, the interior of the chamber because of the Goniometer gears and wheels and so forth and other attachments, has many crevices which makes it relatively time consuming to evacuate to $10^{-9}$ torr.

By way of example, the evacuation of the chamber to $10^{-9}$ torr usually requires about an hour. This does not include the laborious disassembly and assembly of the window and assembly and disassembly of the specimen to its support in the chamber. The sample test is usually completed within 10 or 15 minutes. In comparison, the process of replacing the sample, however, is tedious, time consuming, and fatiguing.

The present inventor recognizes that it would be highly desirable to maintain the vacuum within the spectrometer chamber at all times, therefore, avoiding the need for the time consuming and costly evacuation process for each sample inserted into the chamber. Further, he recognizes that the removal and replacement of many bolts and the hand insertion of a sample and the subsequent bolting of the sample to the support apparatus in the chamber is also undesirable.

In a system according to the present invention having an article holder movably secured within an evacuated first chamber defined by a first housing, an article transfer means is included for transferring an article to be analyzed from without the chamber to within the chamber and for releasably attaching the article to the article holder within the chamber without disturbing the vacuum within the chamber. An article transfer member is included for supporting the article and is adapted to be releasably attached to the article holder within the chamber. A second housing defining a second chamber is adjacent to and outside the first chamber and includes valve means for selectively opening the first chamber in communication with the second chamber. Manipulator means are provided adapted to releasably secure the article transfer member thereto and is aligned for transferring the article transfer member from and to the first and second chambers and includes means for releasably attaching and removing the article transfer member, respectively, to and from the article holder within the first chamber.

Figure 1:
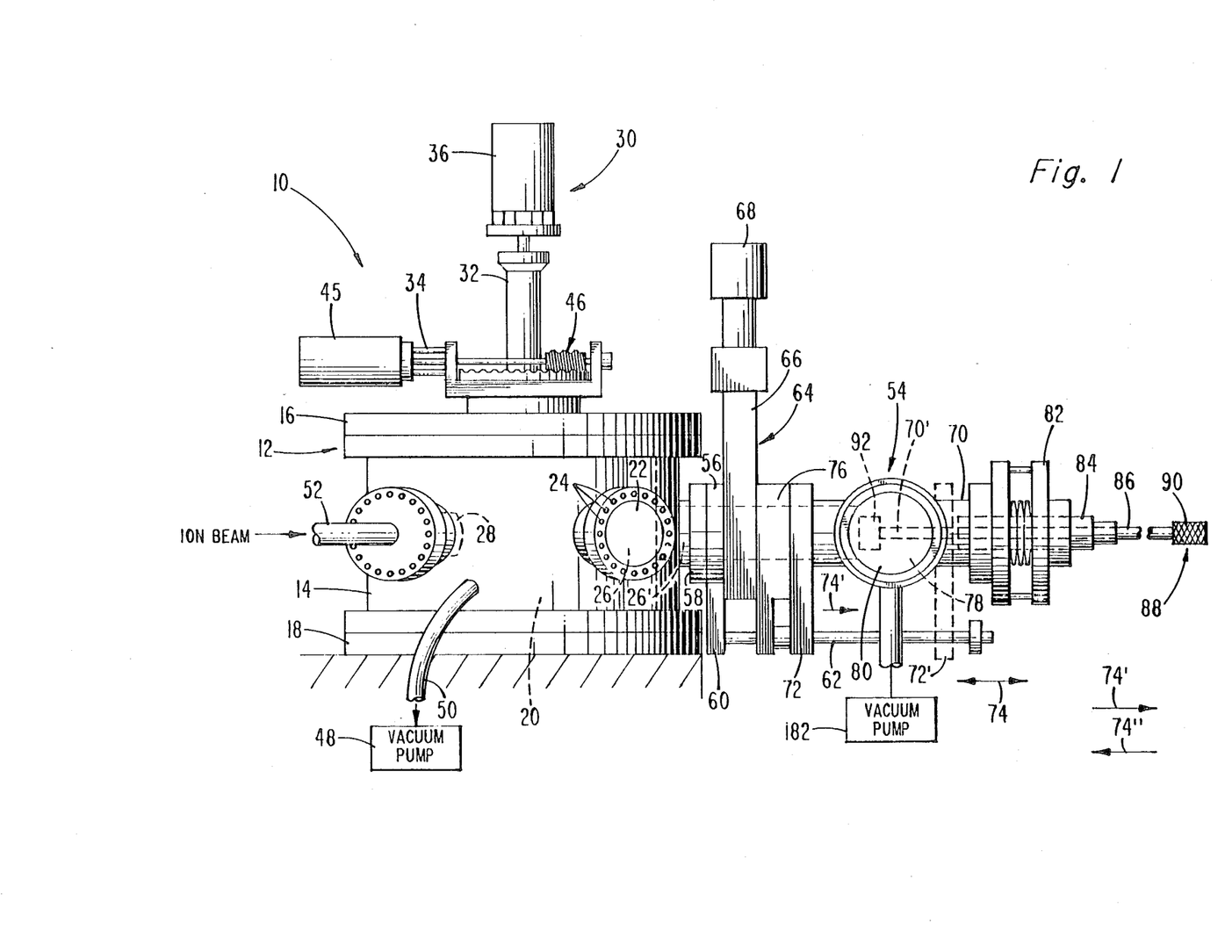
FIG. 1 is a side elevation view of a portion of a Rutherford Backscattering Spectrometer including one embodiment of the present invention.
Figure 2:
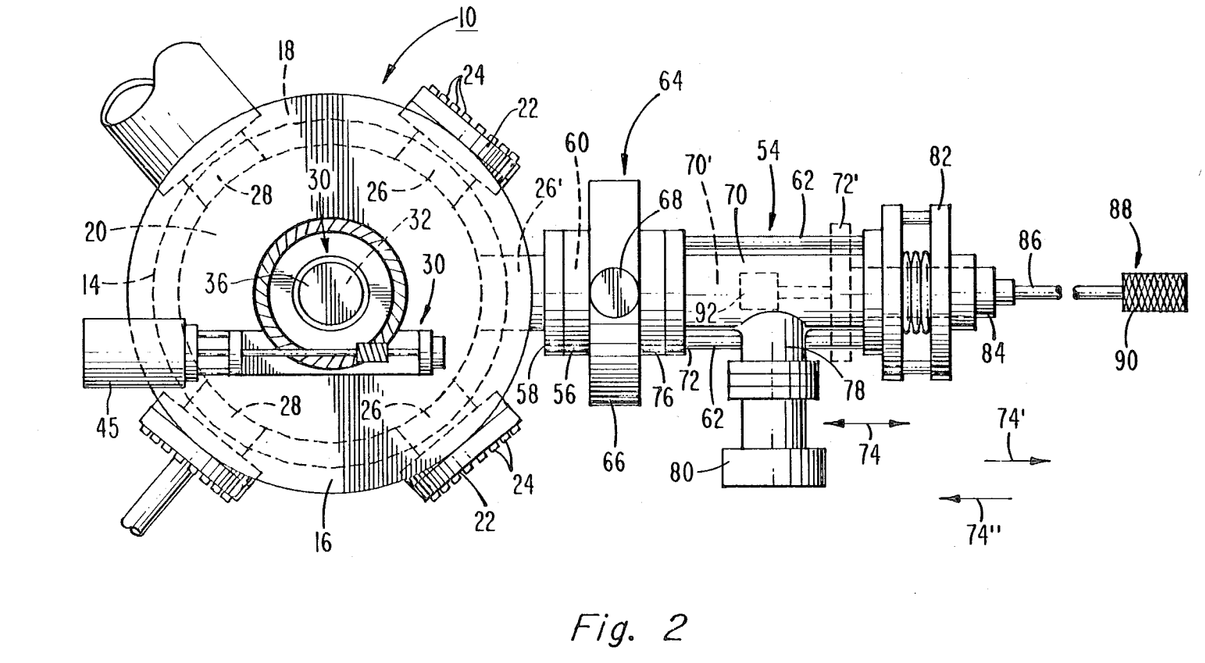
FIG. 2 is a plan view of the spectrometer of the embodiment of FIG. 1.

In FIGS. 1 and 2, spectrometer 10 includes a housing 12 comprising a flanged cylinder 14. Top and bottom plates 16 and 18 are bolted at respective corresponding flanges. Housing 12 has an interior chamber 20. Secured about the periphery of cylinder 14 are a plurality of windows 22, each being secured to a cylinder flange by an array of bolts 24. There are typically about 20 such bolts for each window. Not all of the bolts used to secure the different members together are illustrated in the drawing FIGURES, bolts 24 being representative. Windows 22 cover an opening 26 into the chamber 20. Other openings 28 are in the cylinder 14 for coupling apparatus to chamber 20 in a known way.

Figure 7:
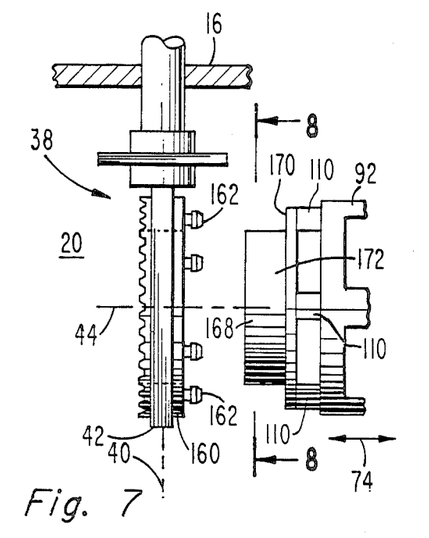
FIG. 7 is a side elevation view, partially diagrammatic, of the article holder within the chamber of the spectrometer of FIGS. 1 and 2.
Figure 8:
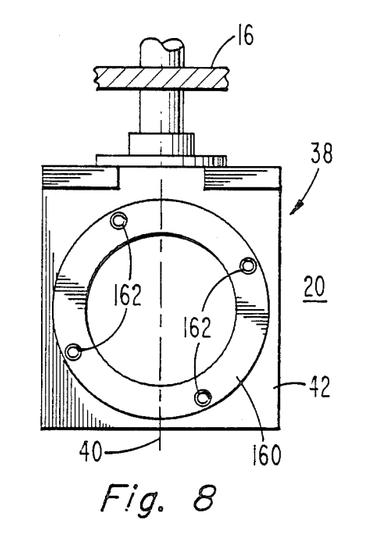
FIG. 8 is an end elevation view of the article holder of FIG. 7 taken along lines 8—8.

Secured to top plate 16 is a Goniometer assembly 30. Goniometer assembly 30 comprises a vertical drive mechanism 32 and a horizontal drive mechanism 34. Mechanism 32 includes a drive motor 36 and a gear system (not shown) for manipulating sample holder assembly 38 (FIG. 7). Assembly 38 is displaced by mechanism 32 parallel to vertical axis 40. Mechanism 32 also rotates the article holder 42 of the sample holder assembly 38 about a horizontal axis 44. The horizontal drive assembly 34, FIG. 1, via worm gear assembly 46 and motor 45 rotates the sample holder assembly 38 (FIG. 7) about vertical axis 40.

A vacuum pump 48 is coupled to chamber 20 via line 50 for evacuating chamber 20 to a high vacuum, for example, $10^{-9}$ torr. Windows 22 and covers over the openings 28 all need to be tightly secured against the mating cylinder support flanges. The covers and flanges are sealed with copper gaskets (not shown) to insure that no leaks occur from the ambient atmosphere into the chamber 20. It is important that such windows and covers be tightly secured by a large number of bolts each time chamber 20 is evacuated.

An ion beam generator (not shown) creates and focuses an ion beam via conduit 52 onto a specimen secured to the article holder 42, FIG. 7. The Goniometer assembly 30, FIG. 1, manipulates the sample holder assembly to position a particular portion of the specimen or sample in the path of the focussed ion beam.

In FIGS. 1 and 2, cylinder 14 has an opening 26' to which is secured housing assembly 54. Assembly 54 serves as a load lock, as will be explained below, and includes a flange member 56 which is secured to a mating flange member 58 of cylinder 14 adjacent opening 26'. Flange member 56 has a depending leg 60 to which is secured a pair of horizontal rods 62.

Secured to flange member 56 is valve assembly 64. Valve assembly 64 comprises a housing 66 containing a valve (not shown) which provides and denies access to opening 26' in response to operation of motor 68 secured to housing 66.

A T-shaped housing 70 has a chamber 70' in communication with opening 26' via the valve of assembly 64. Housing 70 is secured to support member 72 which is slidably secured for axial displacement on rods 62 in directions 74. Support member 72 is releasably bolted to support 76 which is secured to valve housing 66. Housing 70, because it is secured to the support member 72, axially slides with member 72 in horizontal directions 74. Member 72 is in fluid tight sealing engagement with support 76 by rubber O-rings (not shown). The support member 72 is secured to the support 76 with two or three bolts. A large number of bolts is not required because the valve assembly 64 isolates the high vacuum of the chamber of housing 14 from the chamber 70' of housing 70.

A conduit 78, FIG. 2, is coupled to chamber 70' and a turbo vacuum pump 80 is attached to conduit 78. Pump 80 evacuates the chamber 70' to $10^{-9}$ torr. The volume of chamber 70' is significantly smaller than the volume of chamber 20 and can be evacuated in a relatively short time, for example, a few minutes. Also, because housing 70 does not contain all of the apparatus and equipment that is permanently installed inside spectrometer chamber 20, the chamber 70' does not have all of the nooks and crannies and, therefore, surfaces which can accumulate moisture. Such moisture is difficult to remove during the evacuation procedure. For this reason, the smaller chamber 70' can be evacuated in a shorter time than the hour or so that it normally takes to evacuate chamber 20.

Secured to housing 70 is a bellows structure 82 for supporting a gland assembly 84. Gland assembly 84 comprises seals and other mating structure secured to structure 82 for slidably and rotatably receiving and sealing rod 86 of manipulator assembly 88. The rod 86 slides in directions 74 and rotates within the gland assembly 84 by manual manipulation of handle 90. The gland assembly 84 permits the rod 86 to move while sealing the high vacuum within chamber 70' from ambient atmosphere.

Figure 3:
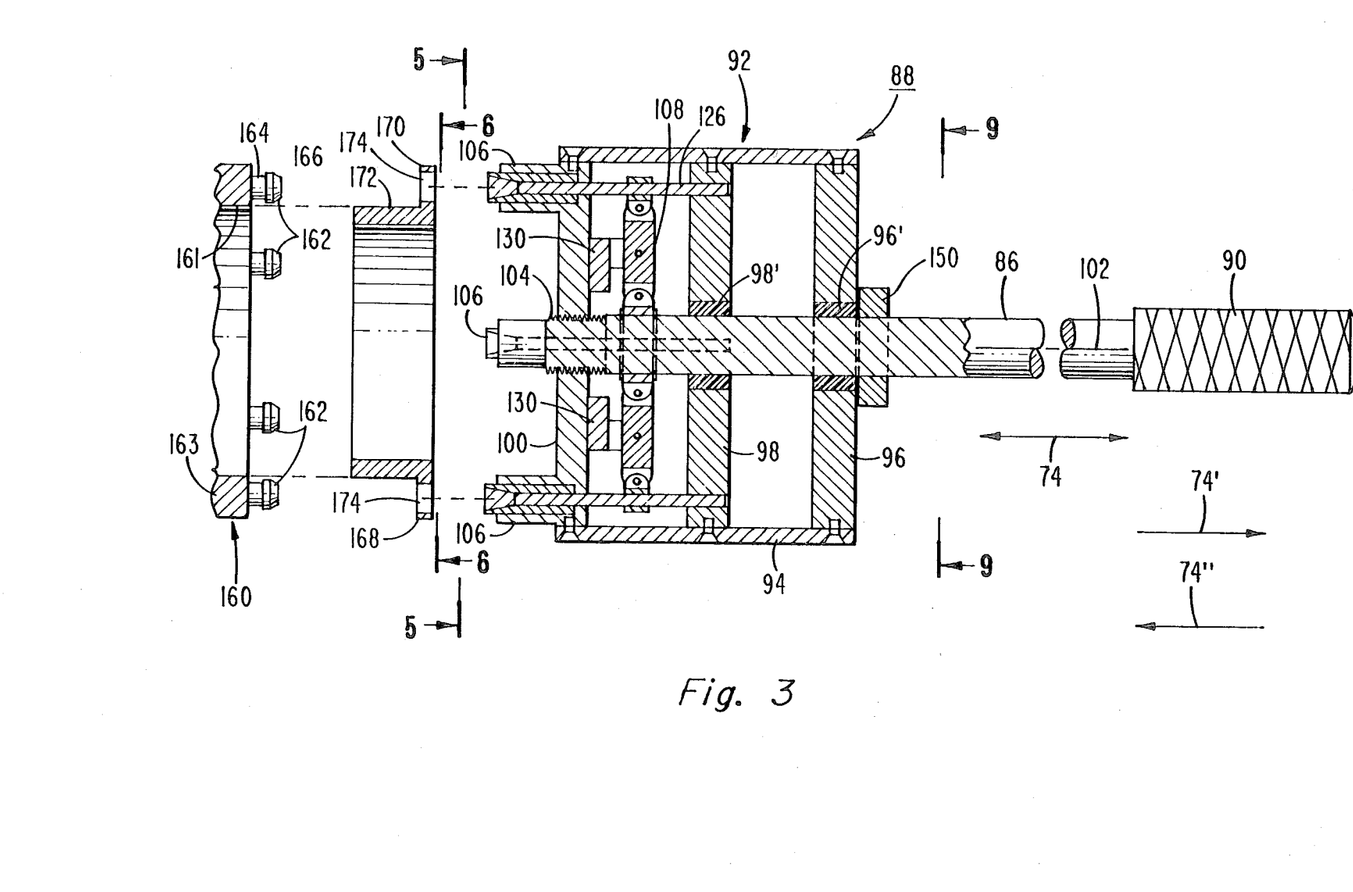
FIG. 3 is an exploded side elevation view, partially in section, of an article transfer manipulator employed in the spectrometer of FIGS. 1 and 2.
Figures 5, 6:
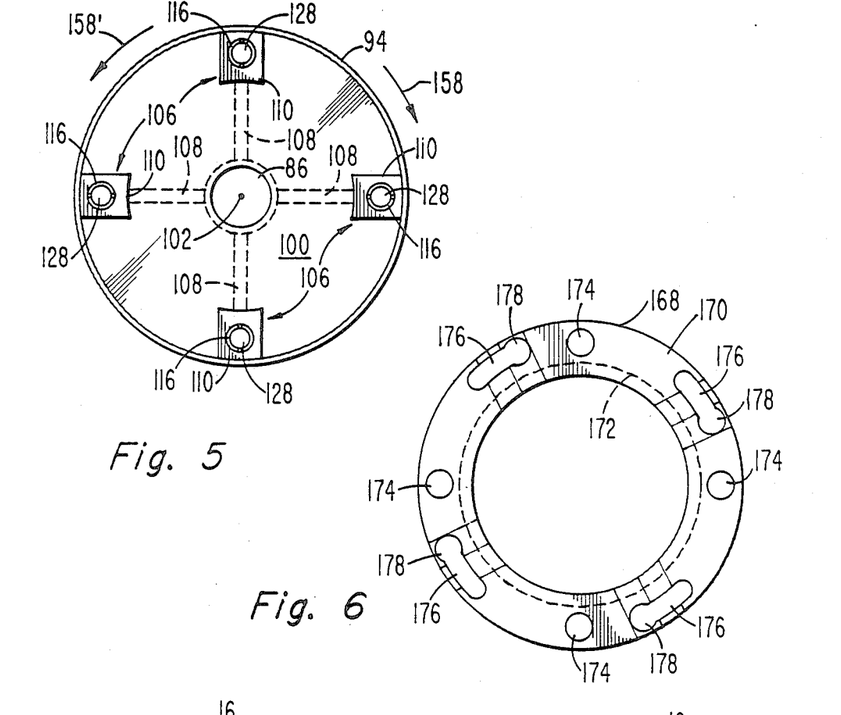
FIG. 5 is an elevation end view of the manipulator of FIG. 3 taken along lines 5—5.
FIG. 6 is an end elevation view of an article transfer member taken along lines 6—6 of FIG. 3.

Manipulator assembly 88, FIG. 3, includes a cylindrical body 92 comprising an outer cylindrical shell 94 and three parallel spaced circular discs 96, 98, and 100. The discs 96 and 98 each have respective mating bearings 96' and 98' which slidably receives rod 86. Bearings 96' and 98' permit rod 86 to rotate about horizontal axis 102 and axially slide in directions 74 relative to body 92. Rod 86 has threads 104 at one end which engage mating threads on disc 100. Rotation of rod 86 about axis 102, because of the engagement of threads 104 with disc 100, displaces body 92 in directions 74 relative to rod 86. Secured to disc 100 are an array of four equally spaced identical mandrel assemblies 106 (FIG. 5). More or fewer can be provided in accordance with a given implementation.

Mandrel assemblies 106 are operated by linkage assembly 108 coupled to shaft 86. Rotation of shaft 86 about axis 102 operates the linkage assembly 108 to expand or contract the mandrels of assemblies 106. The mandrel assemblies are spaced in an array about shaft 86 for operation along parallel axes such as axis 114 parallel to axis 102 and are simultaneously operated by linkage assembly 108 in response to a single rotation of shaft 86 about axis 102.

Figure 4:
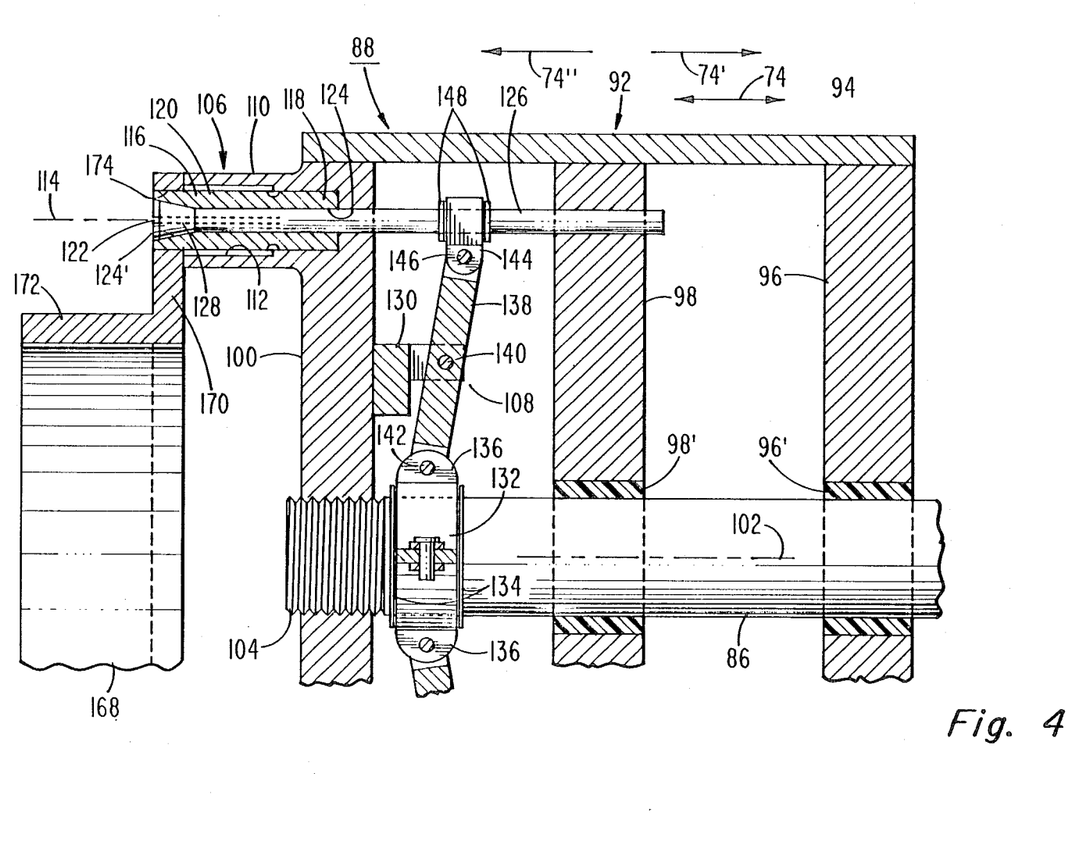
FIG. 4 is an enlarged sectional view of a portion of the manipulator of FIG. 3.

Typical mandrel assembly 106, FIG. 4, comprises a cylindrical projection 110 which extends from disc 100 parallel to axis 102. Projection 110 has a plane end surface normal to axis 114 and a stepped circular cylindrical bore 112 concentric with axis 114. Mandrel 116 is within bore 112. Mandrel 116 comprises a base section 118 press fitted into the narrower diameter portion of bore 112 and an expandable split ring section 120 which is coextensive with the larger diameter portion of bore 112. Ring section 120 is divided by a pair of axially extending slits 122. Mandrel 116 has a cylindrical bore 124 in which is slidably engaged rod 126 having a frustro-conical head 128. Mandrel 116 has a tapered bore 124' at its extended end adjacent slits 122 which mates with and closely receives head 128. When rod 126 is displaced in one of directions 74, head 128 moves relative to mandrel 116 and expands or contracts the mandrel 116 extended end adjacent its tapered bore, depending on the direction of displacement of rod 126.

Secured to disc 100 are four spaced pivot link members 130, two being shown, each corresponding to a mandrel assembly 106. Secured to shaft 86 is an annular link member 132. Link member 132 is slidably secured to shaft 86, displacing with shaft 86 in directions 74 but not rotating with shaft 86. Link member 132 is captured by a pair of snap rings 134 secured to shaft 86. Link member 132 includes four arms 136, only two of which are shown, each corresponding to a mandrel assembly 106. Link member 144 is rotationally secured to rod 126 and captured thereto by a pair of snap rings 148. Link 138 is pivotally secured to link member 130 at pivot 140, to arm 136 at pivot 142, and to link member 144 at pivot 146.

Figure 9:
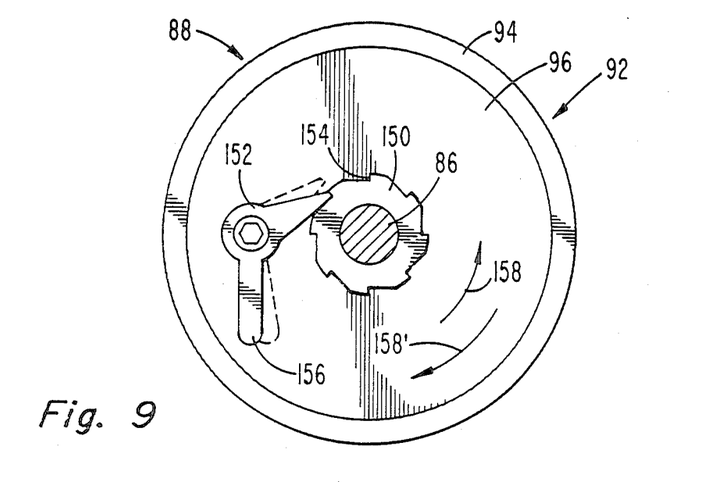
FIG. 9 is a sectional end view of the manipulator of FIG. 3 taken along lines 9—9.

In FIGS. 3 and 9, a ratchet wheel 150 is secured to and rotates with shaft 86. In FIG. 9, pawl 152, secured to disc 96, is normally engaged with the teeth 154 of wheel 150 (by a spring, not shown). Manual displacement of lever 156 to the position shown in phantom disengages the pawl 152 from wheel 150 and permits shaft 86 to rotate in direction 158 relative to disc 96. With the pawl 152 in the position shown in solid, rotation of the shaft 86 and wheel 150 rotates disc 96 therewith in direction 158. Rotation of shaft 86 in direction 158' does not rotate disc 96 and, thus, body 92.

In FIG. 4, to expand mandrel 116 relative to axis 114, shaft 86 is rotated (FIG. 9) in direction 158'. This rotation of shaft 86 relative to body 92 axially displaces shaft 86 in direction 74" relative to body 92 because threads 104 are engaged with disc 100. This displacement rotates link 138 about pivot 140 displacing pivot 146 and rod 126 in direction 74'. The tapered head 128 engages ring section 120 of mandrel 116 and expands the end of the mandrel. The bore 112 of projection 110 is larger than the outer diameter of mandrel 116 to permit the mandrel expansion.

Rotation of shaft 86 in the opposite direction 158, FIG. 9, rotates the body 92 because of the ratchet-pawl engagement. Therefore, the threaded engagement of shaft 86 to disc 100 does not shift and, the mandrel assembly remains in position and the linkage assembly 108 is not operated.

Manual disengagement of pawl 152 with teeth 154 of the ratchet wheel 150, FIG. 9, via lever 156 to the position shown in phantom permits shaft 86 to be rotated in direction 158 relative to body 92. In this case, the threads 104, FIGS. 3 and 4, displace shaft 86 relative to disc 100 and linkage assembly 108 is operated. Pivot 146, FIG. 4, is moved in direction 74'', disengaging head 128 from the tapered bore 124' of mandrel section 120, permitting the mandrel, due to its latent spring stresses, to contract.

In FIG. 7, article holder 42 of assembly 38 includes a support ring 160. In FIG. 3, the support ring 160 includes a ring member 163 and an array of captivating pins 162. Each of the pins 162 comprises a relatively narrow shaft 164 and an enlarged tapered head 166 which is spaced from member 163. Member 163 has a circular bore 161. Article transfer member 168 comprises a circular cylinder 172 having an annular flange 170. A specimen (not shown) to be analyzed by the spectrometer 10, FIGS. 1 and 2, is secured to a circular disc (not shown) which is fastened within the bore of cylinder 172. Cylinder 172 fits within bore 161 of ring 160. In FIG. 6, the transfer member 168 flange 170 has an array of four cylindrical bores 174 each corresponding to a mandrel assembly 106, FIG. 5. Between adjacent bores 174 is an elongated arcuate slot 176 having an enlarged aperture 178 at one end of each slot corresponding to a pin 162 of ring 160, FIG. 3. The enlarged aperture 178 of each slot 176 is at the same end of its slot traversing clockwise about the flange, FIG. 6. The apertures 174 are dimensioned to receive mandrel 116, FIG. 4. In FIG. 4, the mandrel 116 is shown expanded and frictionally engaged with a bore 174 of transfer member 168. All mandrels 116 are simultaneously engaged with corresponding bores 174.

Transfer member 168 is engaged with the mandrel by manually aligning its bores 174 with mandrels 116 so that flange 170 abuts projections 110. Shaft 86 is then rotated to expand the mandrels. This requires rotation of shaft 86 relative to body 92 in direction 158', FIGS. 5 and 9, displacing heads 128 in direction 74', FIG. 3. The mandrels 116 are frictionally secured to each corresponding bore 174 of the transfer member 168. The specimen (not shown) and member 168 to which it is attached have been previously cleaned and stored awaiting attachment to manipulator assembly 88.

Figure 10:
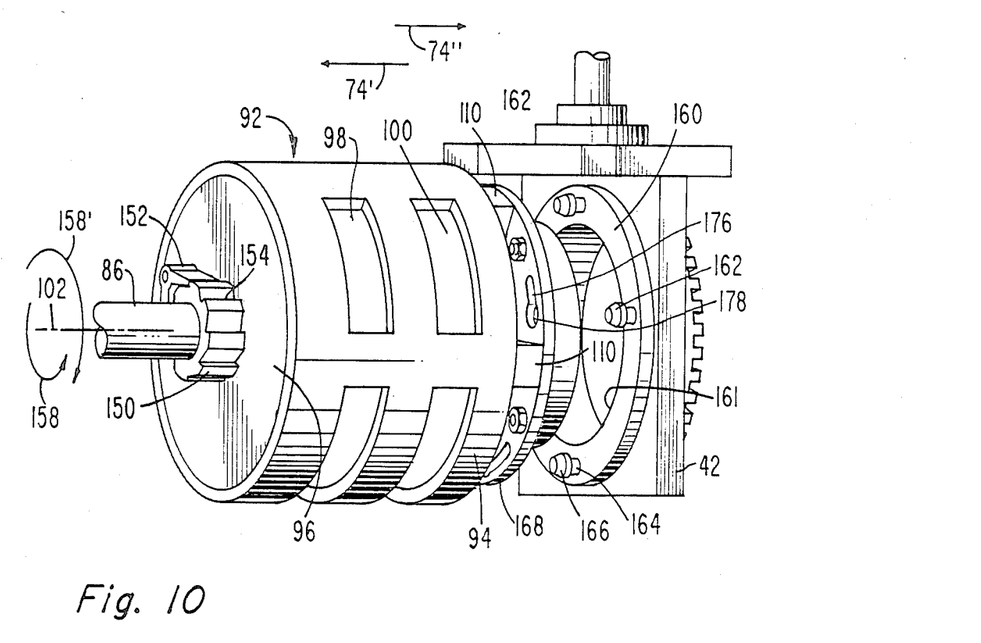
FIG. 10 is a perspective view of the manipulator of FIG. 3 during assembly of the article transfer member to the article holder within the spectrometer chamber.

In FIG. 10, with the transfer member 168 (and specimen) so secured to body 92, the assembly is moved along axis 102 with the enlarged apertures 178 of slots 176 aligned with pins 162 of the support ring 160. The support ring bore 161 receives cylinder 172 as the apertures 178 are engaged with pins 162. Once the pins 162 engage apertures 178 the body 92 of the manipulator assembly is rotated in direction 158'. The narrow slots 176 are thus captivated between the heads 166 of the pins and support ring 160, capturing and, thus, latching the transfer member 168 to the support ring 160.

The transfer member 168 is released from the body 92 by axially pulling body 92 in direction 74' via handle 90, FIG. 1. This pulling action pulls the mandrels free from bores 174 of member 168, FIGS. 3 and 4, because the friction engagement of the mandrels to the bores 174 is insufficient to preclude manual disengagement. The friction engagement is of sufficient force value only to preclude member 168 from accidentally falling off the mandrels inside the spectrometer chamber 20 during the assembly process.

To remove the transfer member 168 from the support ring 160, the mandrels 116, FIG. 3, are engaged with the bores 174 of the transfer member 168. The mandrels 116 have a diameter such that they are easily pushed into bores 174 in friction engagement therewith. The manipulator assembly 88 handle 90 is rotated in direction 158, FIG. 10, to disengage slots 176 from pins 162 of the support ring 160. Because pawl 152 is engaged with ratchet wheel 150, this action also rotates body 92 in direction 158, FIG. 10. When the transfer member 168 is disengaged from the support ring 160, the manipulator assembly 88 via handle 90 is displaced in direction 74' carrying the specimen and the transfer member 168 attached to projections 110 (FIG. 4) out of chamber 20.

The ratchet assembly, FIG. 9, can be employed to adjust the mandrels to closely slidably and frictionally engage the apertures 174 of the transfer member 168, FIG. 3. Subsequent rotation of shaft 86 in direction 158', FIG. 10, also moves the body 92 therewith because the mandrels no longer can expand when inside the bores 174. Thus, member 168 is latched to ring 160 by rotation of the shaft 86 and body 92 assembly. Reversing the rotation of shaft 86 and body 92 disengages the member 168 from ring 160, as described. The friction engagement of the mandrels 116 with bores 174, FIG. 4, is sufficient to preclude the member 168 from dislodging itself in chamber 20 during transfer of member 168. The number of teeth, FIG. 9, on the ratchet wheel 150 is given by way of example, as more or fewer teeth can be used to provide a given adjustment resolution. Once the mandrels 116 are adjusted to closely frictionally engage the bores 174, the rotation of shaft 86 relative to body 92 need not be further made, the mandrels and bores 174 being readily engaged and disengaged.

In FIGS. 1 and 2, in operation, housing assembly 54 is displaced in direction 74 to the position shown in phantom so that support member 72 is positioned at 72'. This requires removal of only three bolts. When in this position the chamber 70' region normally occupied by housing 70 is available for an operator to assemble a transfer member 168, FIG. 3, with a specimen (not shown) secured thereto to the mandrel assemblies 106 of manipulator assembly 88.

With the transfer member 168 attached to the body 92, housing 70 is closed by displacing it in direction 74'' and support member 72 is bolted to valve assembly 64 support 76. Vacuum pump 182 coupled to the chamber 70' evacuates that chamber to $10^{-9}$ torr. When the desired pressure is reached the valve assembly 64 valve is opened. This places chamber 20 in communication with chamber 70'.

The operator grasps the handle 90 of the manipulator assembly 88 and displaces the manipulator body 92, FIG. 3, into chamber 20, FIG. 1. Looking through a window 22, FIG. 2, the operator directs the transfer member 168 motion aligning the enlarged openings 178 with pins 162, FIG. 10. Once engaged, the operator then rotates the manipulator assembly body 92 clockwise, direction 158', FIG. 10, engaging the slots 176 with pins 162 capturing transfer member 168 to the support ring 160. When so engaged, the operator displaces the manipulator assembly 88, FIG. 3, via handle 90 in direction 74' disengaging mandrel assemblies 106, FIG. 4, from the apertures 174 of the transfer member 168. When the body 92 of the manipulator assembly, FIGS. 1 and 2, is within chamber 70', the valve of assembly 64 is closed, isolating chamber 70' from chamber 20. In this way, the vacuum within chamber 20 need not be disturbed while the specimen is attached to the sample holder assembly 38, FIG. 7, within chamber 20.

At the end of the test, the operator reverses the procedure. The valve of assembly 64 is opened and the manipulator body 92, FIG. 3, is placed into the chamber and engaged with the transfer member 168. With the manipulator mandrel assemblies 106 and transfer member bores 174 engaged, the operator then rotates the body 92, FIG. 10, in the counterclockwise direction 158 disengaging the transfer member 168 slots 176 from pins 162. The manipulator assembly is moved axially in direction 74' out of the chamber 20 and into evacuated chamber 70'.

At this time, the valve of assembly 64 is closed, isolating chamber 20 from the chamber 70'. Chamber 70' is then placed at ambient atmospheric pressure. Support member 72 is unfastened from support 76 of the valve assembly 64 and the housing assembly 54 slid in direction 74', FIG. 1, on rods 62. This exposes the end of manipulator assembly body 92 and transfer member 168 to the operator who can then replace transfer member 168 with a second transfer member and specimen and repeat the process. Recall that ratchet pawl 152, FIG. 9, is engaged with ratchet wheel 150 at this time. The pawl 152 can be, in the alternative, manually disengaged from the teeth of the ratchet wheel, as shown in phantom. The ratchet wheel 150 and pawl 152 are in the region of chamber 70', FIGS. 1 and 2, at this time, housing 70 being displaced in direction 74'. By manipulating the lever 156, the shaft 86 is rotated in direction 158 relative to body 92. This action, FIG. 4, displaces the heads 128 to the left direction 74", disengaging the mandrels 116 from bores 174. Once so disengaged, the transfer member 168 is easily removed from the mandrels.

What is claimed is:

1. In a system having an article holder movably secured within an evacuated first chamber defined by a first housing having a first opening, article transfer means for transferring an article from without the first chamber to within the first chamber and for releasably attaching the article to the article holder without disturbing the vacuum within the chamber comprising:

an article transfer member for supporting the article and adapted to be releasably attached to the article holder;

a second housing defining a second chamber having a second opening aligned with and in communication with the first opening, said second chamber being adjacent to and outside the first chamber, said second housing including valve means for sealing the first and second openings and for selectively providing access to the first chamber; and manipulator means moveably secured to the second housing and being adapted to releasably secure the article transfer member thereto and including means for transferring the article transfer member from and to said first and second chambers through said openings and including means for orienting the transfer member relative to said article holder to releasably attach and remove said article transfer member respectively to and from said article holder;

said manipulator means including an expandable mandrel and said article transfer member having an aperture dimensioned to mate with and be releasably secured to said mandrel, said transfer member including latch means for releasably latching to said article holder thereto within said first chamber.

2. The article transfer means of claim 1 further including guide meand adapted to be secured to the first housing and including means for slidably receiving the second housing, said second housing including means for slidably securing the manipulator means thereto for displacing said article transfer member to and from said first and second chambers, said article transfer means including means for selectively evacuating the second chamber and returning the second chamber to ambient atmospheric pressure independently of the pressure in the first chamber.

3. The article transfer means of claim 1 wherein said manipulator means includes a body, a shaft rotatably secured to the body, said body including means for securing the mandrel thereto, and means secured to the body and shaft for selectively expanding and contracting the mandrel in accordance with the relative direction of rotation of said shaft to said body.

4. Article transfer system for transferring an article to a remote article support member comprising:

a support structure;

a body;

a shaft;

means for rotatably securing the shaft to the body and for slidably and rotatably securing the shaft to the support structure;

at least one expandable mandrel secured to the body;

mandrel operating means coupled to the shaft and mandrel and responsive to rotation of the shaft relative to the body for selectively expanding and contracting the mandrel in accordance with the relative angular position of the shaft to the body; and an article carrying member adapted to be releasably secured to the support member and having at least one aperture which mates with said at least one mandrel, said member including means adapted to be secured to said mandrel in one shaft angular position and released from said at least one mandrel in a second shaft angular position relative to the body.

5. The system of claim 4 further including clutch means coupled to said shaft and body for permitting said shaft to rotate relative to the body in one direction to expand the mandrel, said clutch means selectively locking the shaft to the body when the shaft is rotated in a direction opposite the one direction to selectively preclude contracting the mandrel and release of the carrying member in response to the rotation of the shaft in said opposite direction.

6. The system of claim 4 wherein said article carrying member includes means adapted to mate with and be secured to said support member when said carrying member is rotated relative to said support member in one direction and be released from said support member when said carrying member is rotated in a direction opposite the one direction.

7. The system of claim 4 wherein said body includes an array of said mandrels spaced from said shaft, said mandrel operating means including link means coupled to said shaft and array of mandrels for simultaneously operating all of said mandrels in the same expanding and contracting sense.

8. The system of claim 4 wherein said article carrying member includes a plurality of projecting pins each having a shaft portion and an enlarged head portion spaced from the carrying member, said carrying member including a like plurality of elongated openings each having an enlarged opening portion and a narrow opening portion, said enlarged opening portion being dimensioned to pass said enlarged head portion therethrough and capture the article carrying member at the narrow opening portion.

9. The system of claim 8 wherein said article carrying member openings are oriented to engage said support member pins in a first axial direction and to be captivated to said pins when the carrying member and shaft are rotated from the second shaft angular position to the one shaft angular position.

10. The system of claim 9 further including means for selectively locking the shaft to said body after the shaft is rotated from said one shaft angular position to the second shaft angular position to preclude releasing said at least one mandrel from said at least one aperture.

11. An article transfer system comprising:
a first housing defining a first chamber having a first opening;
means for selectively evacuating the first chamber;
a second housing defining a second chamber having a second opening aligned with and in communication with the first opening;
means for selectively evacuating the second chamber;
valve means for selectively coupling said first and second chambers at said aligned first and second openings;
an article support member in the first chamber;
an article transfer member including means adapted to be releasably secured to said support member; and
an article manipulating device secured to at least one of said housings and adapted for movement to and from each of said chambers through said first and second openings, said device including expanding mandrel means adapted to selectively secure and release said article transfer member thereto, said device being secured to said at least one housing and including means to align and cause said article transfer member to be attached to said support member.

12. The system of claim 11 wherein said device includes a body and a set of expandable mandrels secured to the body, shaft means rotatably secured to the body and adapted to selectively expand and contract the mandrels, said article transfer member including a first set of bores adapted to receive and be secured to said mandrels when expanded and a second set of apertures, said support member including means adapted to mate with said second set of apertures for releasably securing the transfer member thereto, and means for aligning the transfer member, mandrels and support member for affecting transfer of said transfer member from and to said support member and mandrels.

* * * * *